(12) United States Patent
Yu et al.

(10) Patent No.: US 6,387,758 B1
(45) Date of Patent: May 14, 2002

(54) METHOD OF MAKING VERTICAL FIELD EFFECT TRANSISTOR HAVING CHANNEL LENGTH DETERMINED BY THE THICKNESS OF A LAYER OF DUMMY MATERIAL

(75) Inventors: Allen S. Yu, Fremont; Chau M. Ho, San Mateo, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/817,625

(22) Filed: Mar. 26, 2001

(51) Int. Cl.[7] .............................................. H01L 21/336
(52) U.S. Cl. ........................ 438/269; 438/300; 438/563
(58) Field of Search ................................. 438/138, 268, 438/269, 270, 300, 558, 559, 563

(56) References Cited

U.S. PATENT DOCUMENTS 6,020,239 A * 2/2000 Gambino et al. ........... 438/269
6,127,230 A * 10/2000 Tang et al. ................. 438/269
6,197,640 B1 * 3/2001 Davies ....................... 438/269

OTHER PUBLICATIONS

Hon–Sum Philip Wong et al., *Nanoscale CMOS*, Proceedings of the IEEE, vol. 87, No. 4, Apr. 1999.

* cited by examiner

*Primary Examiner*—Chandra Chaudhari
(74) *Attorney, Agent, or Firm*—Monica H. Choi

(57) ABSTRACT

For fabricating a vertical field effect transistor on a semiconductor substrate, a bottom layer of doped insulating material is deposited on the semiconductor substrate. A layer of dummy material is deposited on the bottom layer of doped insulating material. A top layer of doped insulating material is deposited on the layer of dummy material. An opening is etched through the top layer of doped insulating material, the layer of dummy material, and the bottom layer of doped insulating material. A semiconductor fill is contained within the opening. The semiconductor fill has at least one sidewall with a top portion of the sidewall abutting the top layer of doped insulating material, a middle portion of the sidewall abutting the layer of dummy material, and a bottom portion of the sidewall abutting the bottom layer of doped insulating material. The layer of dummy material is etched away such that the middle portion of the sidewall of the semiconductor fill is exposed. A gate electrode opening disposed between the top and bottom layers of doped insulating material is formed when the layer of dummy material is etched away. A gate dielectric of the vertical field effect transistor is formed on the exposed middle portion of the sidewall of the semiconductor fill. The electrode opening between the top and bottom layers of doped insulating material is filled with electrode material to form a gate electrode on the dielectric. Dopant diffuses from the bottom and top layers of doped insulating material into the bottom and top portions of the semiconductor fill to form first and second drain or source extension junctions respectively.

21 Claims, 9 Drawing Sheets

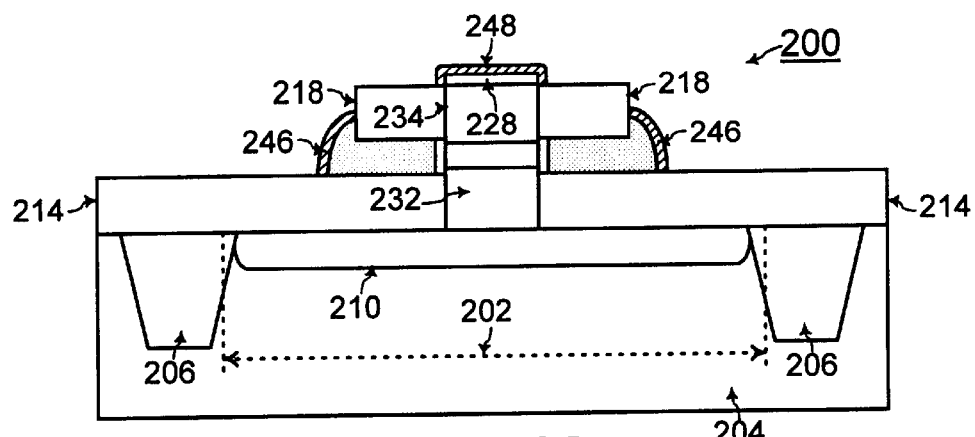
FIG. 13
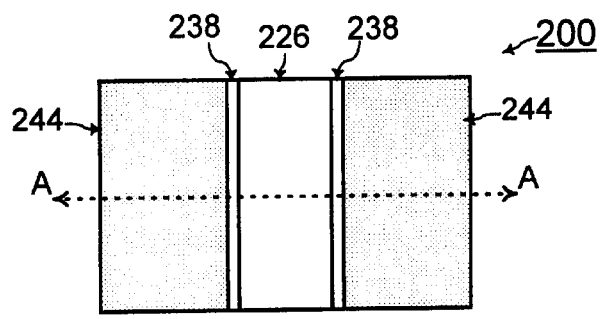
FIG. 14
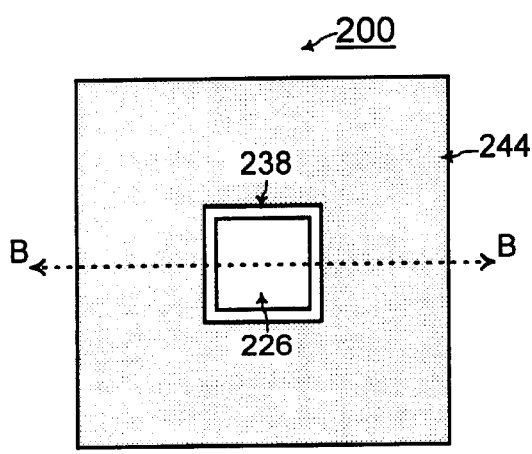 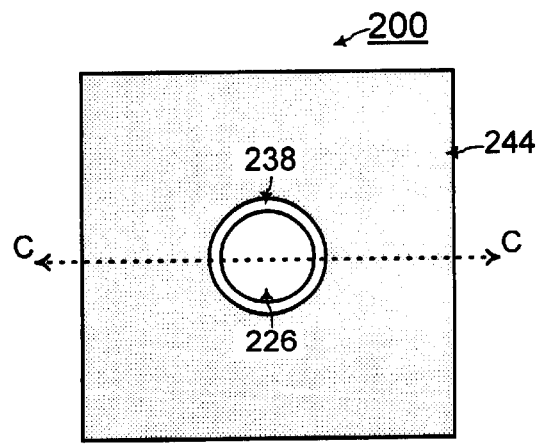
FIG. 15A  FIG. 15B

US 6,387,758 B1

METHOD OF MAKING VERTICAL FIELD EFFECT TRANSISTOR HAVING CHANNEL LENGTH DETERMINED BY THE THICKNESS OF A LAYER OF DUMMY MATERIAL

TECHNICAL FIELD

This invention relates generally to field effect transistors, and more particularly to a vertical field effect transistor fabricated by growing a semiconductor material within an opening formed through doped insulating materials for defining the drain and source extension junctions of the vertical field effect transistor and through a layer of dummy material deposited between the doped insulating materials for defining the channel region of the vertical field effect transistor.

BACKGROUND OF THE INVENTION

Referring to FIG. 1, a common component of a monolithic IC is a planar MOSFET (Metal Oxide Semiconductor Field Effect Transistor) 100 which is fabricated within a semiconductor substrate 102. The scaled down MOSFET 100 having submicron or nanometer dimensions includes a drain extension junction 104 and a source extension junction 106 formed within an active device area 126 of the semiconductor substrate 102. The drain extension junction 104 and the source extension junction 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where the MOSFET 100 is fabricated therein.

The MOSFET 100 also includes a spacer 122 disposed on the sidewalls of the gate electrode 118 and the gate dielectric 116. When the spacer 122 is comprised of silicon nitride ($Si_3N_4$), then a spacer liner oxide 124 is deposited as a buffer layer between the spacer 122 and the sidewalls of the gate electrode 118 and the gate dielectric 116.

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

As the dimensions of the MOSFET 100 are scaled down to tens of nanometers, short-channel effects degrade the performance of the MOSFET 100. Short-channel effects that result due to the short length of the channel region between the drain extension junction 104 and the source extension junction 106 of the MOSFET 100 are known to one of ordinary skill in the art of integrated circuit fabrication. The electrical characteristics of the MOSFET 100 become difficult to control with bias on the gate electrode 118 with short-channel effects which may severely degrade the performance of the MOSFET.

As the dimensions of the MOSFET 100 are further scaled down to tens of nanometers, short channel effects are more likely to disadvantageously affect the operation of the MOSFET 100, as known to one of ordinary skill in the art of integrated circuit fabrication. In the conventional planar MOSFET 100 of FIG. 1, the gate dielectric 116 and the gate electrode 118 are disposed over one plane of the channel region between the drain and source extension junctions 104 and 106. However, as the dimensions of the MOSFET 100 are further scaled down to tens of nanometers, control of charge accumulation within the channel region of the MOSFET from a plurality of planes of the channel region is desired to minimize short channel effects.

SUMMARY OF THE INVENTION

Accordingly, the present invention is directed to fabrication of a vertical field effect transistor having a respective gate dielectric and a respective gate electrode formed at each of a plurality of planes of the channel region of the vertical field effect transistor to minimize undesired short channel effects.

In a general aspect of the present invention, for fabricating a vertical field effect transistor on a semiconductor substrate, a first drain or source contact junction is doped with a first dopant within an active device area of the semiconductor substrate. A bottom layer of doped insulating material is deposited on the semiconductor substrate, and the bottom layer of doped insulating material is doped with a second dopant. A layer of dummy material is deposited on the bottom layer of doped insulating material. A top layer of doped insulating material is deposited on the layer of dummy material, and the top layer of doped insulating material is doped with a third dopant.

An opening is etched through the top layer of doped insulating material, the layer of dummy material, and the bottom layer of doped insulating material. The opening is disposed over the active device area of the semiconductor substrate such that the opening has a bottom wall of the semiconductor substrate. The opening is filled with a semiconductor material to form a semiconductor fill contained within the opening. The semiconductor fill has at least one sidewall with a top portion of the at least one sidewall abutting the top layer of doped insulating material, and with a middle portion of the at least one sidewall abutting the layer of dummy material, and with a bottom portion of the at least one sidewall abutting the bottom layer of doped insulating material.

The layer of dummy material is etched away such that the middle portion of the at least one sidewall of the semiconductor fill is exposed. A gate electrode opening disposed between the top and bottom layers of doped insulating material is formed when the layer of dummy material is etched away. A gate dielectric of the vertical field effect transistor is formed on the exposed middle portion of the at least one sidewall of the semiconductor fill. The middle portion of the semiconductor fill abutting the gate dielectric forms a channel region of the vertical field effect transistor.

The gate electrode opening between the top and bottom layers of doped insulating material is filled with a gate electrode material. The gate electrode material abuts the gate dielectric to form a gate electrode of the vertical field effect transistor. The gate dielectric and the gate electrode formed at the sidewall of the semiconductor fill is disposed on a plurality of planes of the channel region of the vertical field effect transistor. A thermal anneal is performed such that the second dopant diffuses from the bottom layer of doped insulating material into the bottom portion of the semiconductor fill to form a first drain or source extension junction of the vertical field effect transistor, and such that the third dopant diffuses from the top layer of doped insulating material into the top portion of the semiconductor fill to form a second drain or source extension junction of the vertical field effect transistor.

In one embodiment of the present invention, the bottom and top layers of the doped insulating material are comprised of PSG (phospho-silicate glass) such that the second and third dopants are comprised of phosphorous for formation of a vertical NMOSFET (N-channel Metal Oxide Semiconductor Field Effect Transistor). In an alternative embodiment of the present invention, the bottom and top layers of the doped insulating material are comprised of BSG (borosilicate glass) such that the second and third dopants are comprised of boron for formation of a vertical PMOSFET (P-channel Metal Oxide Semiconductor Field Effect Transistor).

In this manner, a vertical field effect transistor is formed to have a respective gate dielectric and a respective gate electrode on each of a plurality of planes of the channel region formed within the semiconductor fill for better control of charge accumulation within the channel region such that undesired short channel effects are minimized. In addition, with application of bias voltage on the respective gate electrode at each of a plurality of planes of the channel region, higher drive current is achieved for enhanced speed performance of the vertical field effect transistor. Furthermore, the length of the channel region is determined by the thickness of the layer of dummy material deposited between the top and bottom layers of doped insulating material. Thus, the length of the channel region of the vertical field effect transistor may be scaled down beyond those possible from photolithography limitations.

These and other features and advantages of the present invention will be better understood by considering the following detailed description of the invention which is presented with the attached drawings.

BRIEF DESCRIPTION OF THE DRAWINGS

FIG. 13 shows a cross sectional view of the vertical MOSFET of FIG. 12 with the drain or source extension junctions extending inward through a portion of a semiconductor fill, according another embodiment of the present invention;

FIG. 14 shows a top view of the channel region and the respective gate dielectric and the respective gate electrode at each of two sidewalls of the semiconductor fill for the vertical MOSFET of FIG. 12, according to an embodiment of the present invention;

FIG. 15A shows a top view of the channel region and the respective gate dielectric and the respective gate electrode at each of four sidewalls of the semiconductor fill having a square shape for the vertical MOSFET of FIG. 12, according to another embodiment of the present invention;

FIG. 15B shows a top view of the channel region and the respective gate dielectric and the respective gate electrode surrounding the semiconductor fill having a circular shape for the vertical MOSFET of FIG. 12, according to another embodiment of the present invention;

The figures referred to herein are drawn for clarity of illustration and are not necessarily drawn to scale. Moreover, the figures referred to herein show a vertical MOSFET that is typically part of a larger integrated circuit. Elements having the same reference number in FIGS. 1, 2, 3, 4, 5, 6, 7, 8, 9, 10, 11, 12, 13, 14, 15A, 15B, 16, 17, 18, 19, 20, 21, 22, 23, 24, 25, and 26 refer to elements having similar structure and function.

DETAILED DESCRIPTION

Example embodiments of the present invention are illustrated and described for forming a vertical MOSFET within an active device area of a bulk semiconductor substrate. However, the present invention may also be applied for forming a vertical MOSFET within an active device area of a semiconductor film formed on an insulating layer in SOI (semiconductor on insulator) technology, as would be apparent to one of ordinary skill in the art of integrated circuit fabrication from the description herein.

Figure 1:
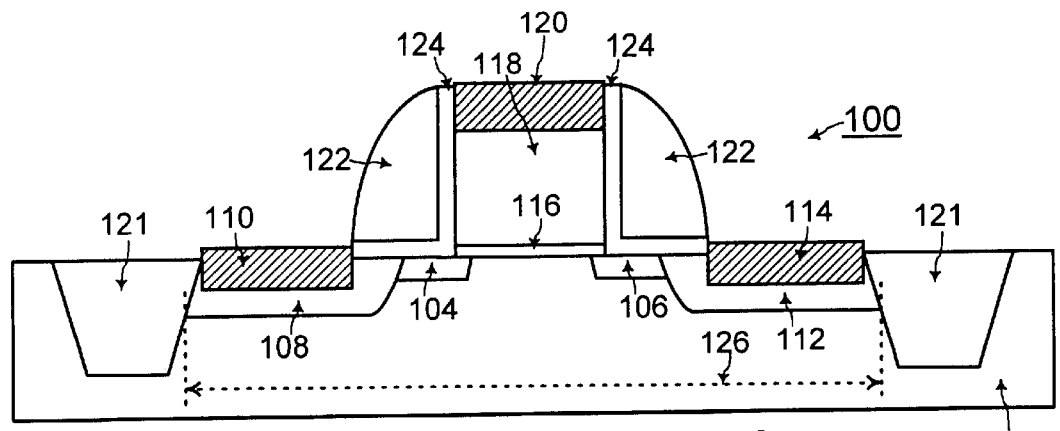
FIG. 1 shows a cross sectional view of a conventional planar MOSFET fabricated within a semiconductor substrate according to the prior art.
Figure 2:
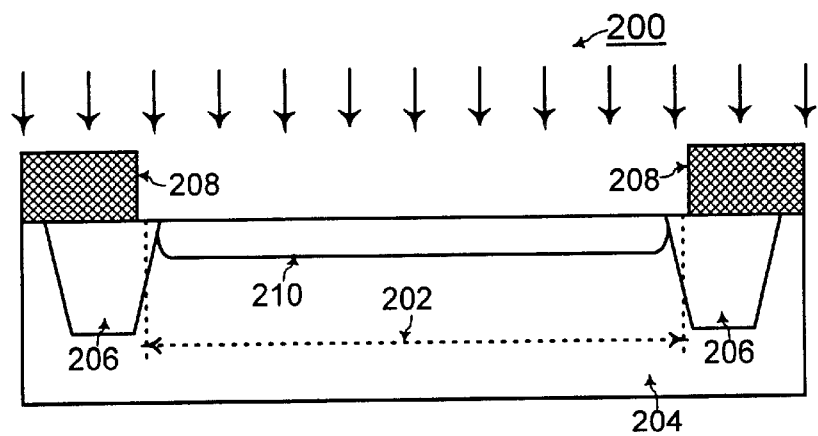
FIGS. 2, 3, 4, 5, 6, 7, 8, 9, 10, 11, and 12 show cross sectional views of a vertical MOSFET fabricated by forming a semiconductor fill within an opening formed through layers of doped insulating material and a layer of dummy material such that a respective gate dielectric and a respective gate electrode are formed at each of a plurality of planes of the channel region formed from the semiconductor fill, to minimize undesired short channel effects according to an embodiment of the present invention.

Referring to FIG. 2, for fabricating a vertical MOSFET 200 of an embodiment of the present invention, a first dopant is implanted into an active device area 202 of a semiconductor substrate 204 defined by shallow trench isolation structures 206. The semiconductor substrate 204 is comprised of silicon or a silicon substrate with germanium doping as known to one of ordinary skill in the art of integrated circuit fabrication, according to one embodiment of the present invention. The shallow trench isolation structures 206 are comprised of a dielectric material as known to one of ordinary skill in the art of integrated circuit fabrication, according to one embodiment of the present invention. Processes for fabrication of shallow trench isolation structures 206 for defining the active device area 202 of the semiconductor substrate 204 are known to one of ordinary skill in the art of integrated circuit fabrication.

Masking structures 208 comprised of photoresist material according to one embodiment of the present invention define a first drain or source contact junction 210 having the first dopant implanted therein. The masking structures 208 block the first dopant from being implanted into the areas of the semiconductor substrate 204 covered by the masking structures 208. Processes for patterning the masking structures 208 to define the first drain or source contact junction 210 are known to one of ordinary skill in the art of integrated circuit fabrication.

Figure 3:
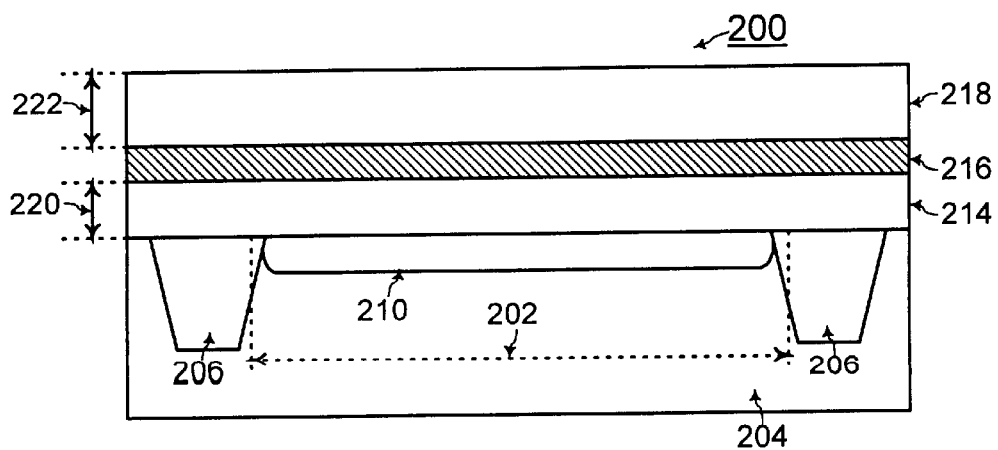

Referring to FIG. 3, after formation of the first drain or source contact junction 210, the masking structures 208 are etched away. Processes for etching away the masking structures 208 which are comprised of photoresist material according to one embodiment of the present invention are known to one of ordinary skill in the art of integrated circuit fabrication. Further referring to FIG. 3, a bottom layer of doped insulating material 214 is deposited on the semiconductor substrate 204. The bottom layer of doped insulating material 214 has a first thickness 220 and is doped with a second dopant. In addition, a layer of dummy material 216 is deposited on the bottom layer of doped insulating material 214. The layer of dummy material 216 is comprised of silicon nitride ($Si_3N_4$) according to one embodiment of the present invention. Furthermore, a top layer of doped insulating material 218 is deposited on the layer of dummy material 216. The top layer of doped insulating material 218 has a second thickness 222 and is doped with a third dopant.

The layer of dummy material 216 may be comprised of other suitable materials such as silicon oxynitride (SiON) or a silicon rich nitride film as known to one of ordinary skill in the art of integrated circuit fabrication. Generally, the present invention may be practiced when the layer of dummy material 216 is comprised of a material having a different etch rate than that of the top and bottom layers of doped insulating material 214 and 218.

According to one embodiment of the present invention, the bottom layer of doped insulating material 214 and the top layer of doped insulating material 218 are comprised of PSG (phospho-silicate glass). In that case, the first dopant within the first drain or source contact junction 210, the second dopant within the bottom layer of doped insulating material 214, and the third dopant within the top layer of doped insulating material 218 are comprised of phosphorous for fabrication of a vertical NMOSFET (N-channel metal oxide semiconductor field effect transistor). In another embodiment of the present invention, the bottom layer of doped insulating material 214 and the top layer of doped insulating material 218 are comprised of BSG (boro-silicate glass). In that case, the first dopant within the first drain or source contact junction 210, the second dopant within the bottom layer of doped insulating material 214, and the third dopant within the top layer of doped insulating material 218 are comprised of boron for fabrication of a vertical PMOSFET (P-channel metal oxide semiconductor field effect transistor). Processes for deposition of such a bottom layer of doped insulating material 214, such a layer of dummy material 216, and such a top layer of doped insulating material 218 are known to one of ordinary skill in the art of integrated circuit fabrication.

Figure 4:
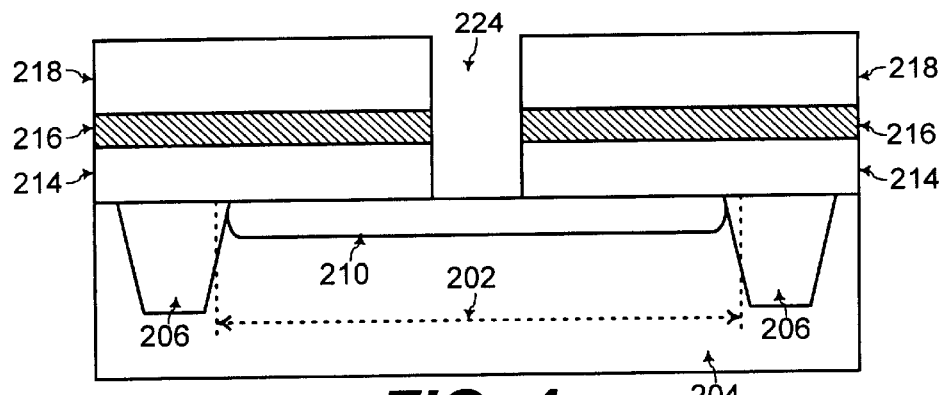

Referring to FIG. 4, an opening 224 is etched through the bottom layer of doped insulating material 214, the layer of dummy material 216, and the top layer of doped insulating material 218. The opening 224 is disposed over the active device area 202 of the semiconductor substrate 204 such that a bottom wall of the opening 224 is formed by the first drain or source contact junction 210. Processes such as photolithography processes for patterning the opening 224 through the bottom layer of doped insulating material 214, the layer of dummy material 216, and the top layer of doped insulating material 218 are known to one of ordinary skill in the art of integrated circuit fabrication.

Figure 5:
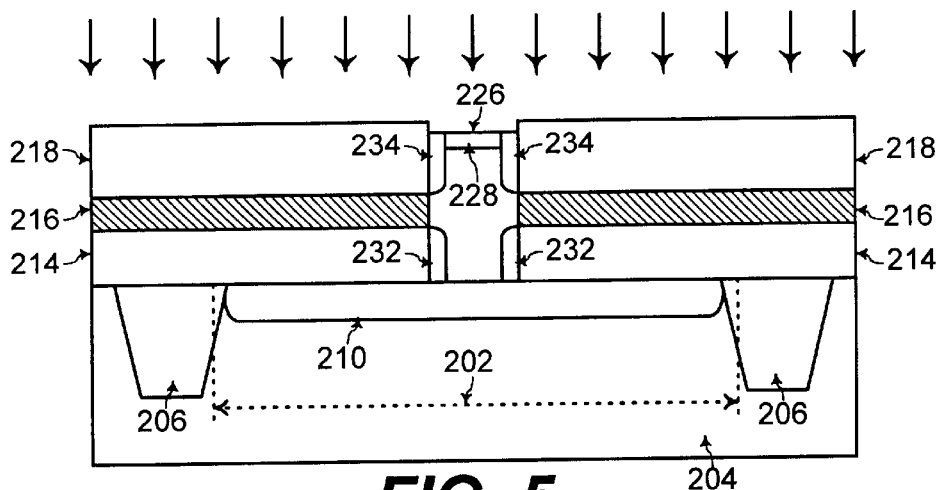

Referring to FIGS. 4 and 5, a semiconductor fill 226 is formed to fill the opening 224. In one embodiment of the present invention, the semiconductor fill 226 is comprised of silicon epitaxially grown from the semiconductor substrate 204 at the bottom wall of the opening 224. In that case, the semiconductor substrate 204 acts as a seed for the epitaxial growth of the semiconductor fill 226 at the bottom wall of the opening 224. Processes for epitaxially growing the semiconductor fill 226 comprised of silicon are known to one of ordinary skill in the art of integrated circuit fabrication.

For epitaxially growing silicon from the semiconductor substrate 204 at the bottom wall of the opening 224, one of the following reactants are typically used as the silicon source: silicon tetrachloride ($SiCl_4$), trichlorosilane ($SiHCl_3$), dichlorosilane ($SiH_2Cl_2$), and silane ($SiH_4$). The temperature used for epitaxial growth of silicon from such reactants decreases with a lower number of chlorine atoms and a higher number of hydrogen atoms for such reactants. For example, the temperature for epitaxial growth of silicon from tetrachloride ($SiCl_4$) is in a range of from about 1150° Celsius to about 1250° Celsius. The temperature for epitaxial growth of silicon from trichlorosilane ($SiHCl_3$) is in a range of from about 1100° Celsius to about 1200° Celsius. The temperature for epitaxial growth of silicon from dichlorosilane ($SiH_2Cl_2$) is in a range of from about 1050° Celsius to about 1150° Celsius. The temperature for epitaxial growth of silicon from silane ($SiH_4$) is in a range of from about 950° Celsius to about 1050° Celsius.

In one embodiment of the present invention, silane ($SiH_4$) is used as the reactant for epitaxial growth of silicon for the semiconductor fill 226 such that a lowest possible temperature may be used for the epitaxial growth of silicon for the semiconductor fill 226. A lower temperature is advantageous for minimizing transient diffusion of dopant for the vertical field effect transistor 200 having scaled down dimensions of tens of nanometers. In addition, referring to FIGS. 3 and 5, the second thickness 222 of the top layer of doped insulating material 218 is higher than the first thickness 220 of the bottom layer of doped insulating material 214 to ensure that the semiconductor fill 226 does not grow out of the opening 224.

Further referring to FIG. 5, after formation of the semiconductor fill 226, a fourth dopant is implanted through the top surface of the semiconductor fill 226 to form a second drain or source contact junction 228. The second drain or source contact junction 228 is the top portion of the semiconductor fill 226 having the fourth dopant implanted therein. The fourth dopant may be comprised of phosphorous when the first dopant within the first drain or source contact junction 210, the second dopant within the bottom layer of doped insulating material 214, and the third dopant within the top layer of doped insulating material 218 are comprised of phosphorous for fabrication of a vertical NMOSFET (N-channel metal oxide semiconductor field effect transistor). Alternatively, the fourth dopant may be comprised of boron when the first dopant within the first drain or source contact junction 210, the second dopant within the bottom layer of doped insulating material 214, and the third dopant within the top layer of doped insulating material 218 are comprised of boron for fabrication of a vertical PMOSFET (P-channel metal oxide semiconductor field effect transistor).

In addition, referring to FIG. 5, the semiconductor fill 226 has at least one sidewall (including a left sidewall and a right sidewall in FIG. 5). A top portion of the at least one sidewall of the semiconductor fill 226 abuts the top layer of doped insulating material 218. A middle portion of the at least one sidewall of the semiconductor fill 226 abuts the layer of dummy material 216. A bottom portion of the at least one sidewall of the semiconductor fill 226 abuts the bottom layer of doped insulating material 214.

The second dopant from the bottom layer of doped insulating material 214 diffuses into the bottom portion of the semiconductor fill 226 to form a first drain or source extension junction 232 during a thermal anneal process. Similarly, the third dopant from the top layer of doped insulating material 218 diffuses into the top portion of the semiconductor fill 226 to form a second drain or source extension junction 234 during a thermal anneal process. Thermal anneal processes are known to one of ordinary skill in the art of integrated circuit fabrication.

Figure 6:
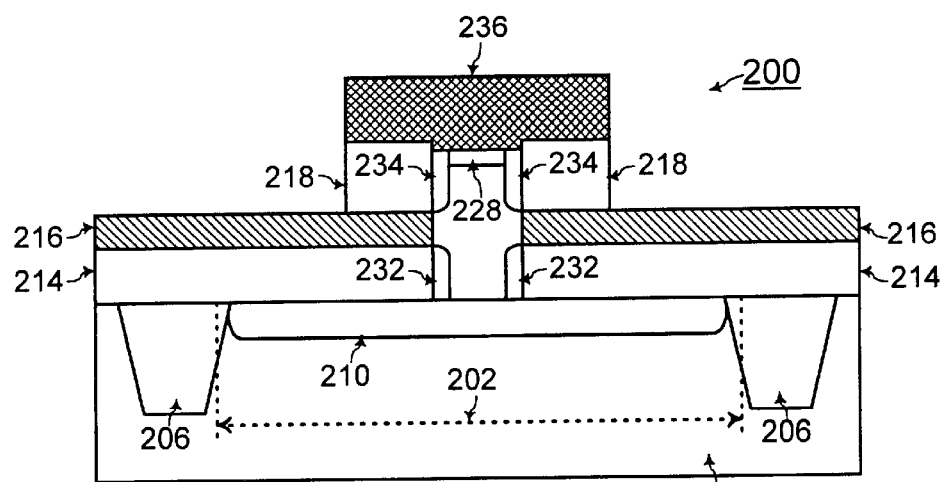

Referring to FIGS. 5 and 6, a masking structure 236 comprised of photoresist material in one embodiment of the present invention is formed over an inner portion of the top layer of doped insulating material 218. Photolithography processes for forming the masking structure 236 comprised of photoresist material are known to one of ordinary skill in the art of integrated circuit fabrication. Any outer portion of the top layer of doped insulating material 218 not covered by the masking structure 236 is etched away to expose the layer of dummy material 216. Processes for selectively etching away the top layer of doped insulating material 218 comprised of silicate glass while preserving the layer of dummy material 216 comprised of silicon nitride ($Si_3N_4$) for example are known to one of ordinary skill in the art of integrated circuit fabrication.

Figure 7:
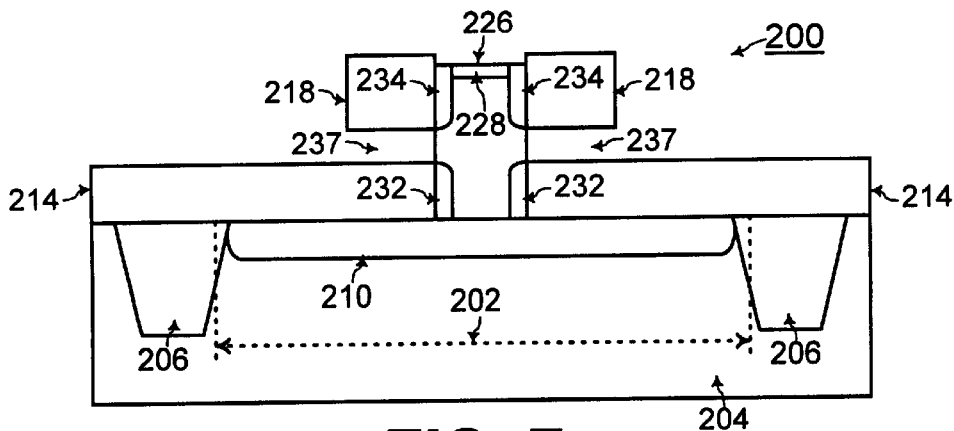

Referring to FIGS. 6 and 7, the masking structure 236 and the layer of dummy material 216 are etched away. Processes for etching away the masking structure 236 which is comprised of photoresist and for etching away the layer of dummy material 216 which is comprised of silicon nitride ($Si_3N_4$) for example are known to one of ordinary skill in the art of integrated circuit fabrication. A gate electrode opening 237 is formed between the top layer of doped insulating material 218 and the bottom layer of doped insulating material 214 when the layer of dummy material 216 is etched away. In addition, the middle portion of the sidewall of the semiconductor fill 226 is exposed when the layer of dummy material 216 is etched away.

Figure 8:
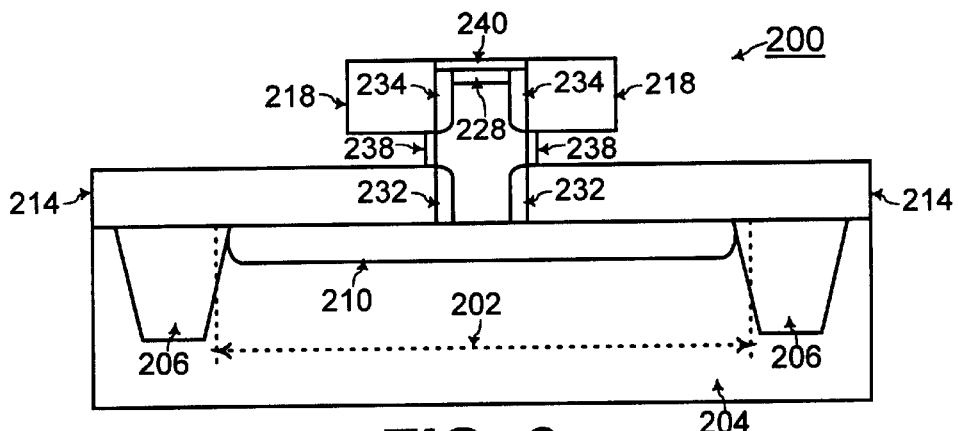

Referring to FIGS. 7 and 8, a gate dielectric 238 is formed on the exposed middle portion of the sidewall of the semiconductor fill 226. The gate dielectric 238 may be comprised of silicon dioxide ($SiO_2$) thermally grown from the exposed middle portion of the sidewall of the semiconductor fill 226 comprised of silicon according to one embodiment of the present invention. Processes for thermally growing silicon dioxide ($SiO_2$) for the gate dielectric 238 are known to one of ordinary skill in the art of integrated circuit fabrication. During such a process, a silicon dioxide ($SiO_2$) structure 240 also grows from the exposed top surface of the semiconductor fill 226. The middle portion of the semiconductor fill 226 abutting the gate dielectric 238 and disposed between the drain or source extensions junctions 232 and 234 forms the channel region of the vertical MOSFET 200.

Figure 9:
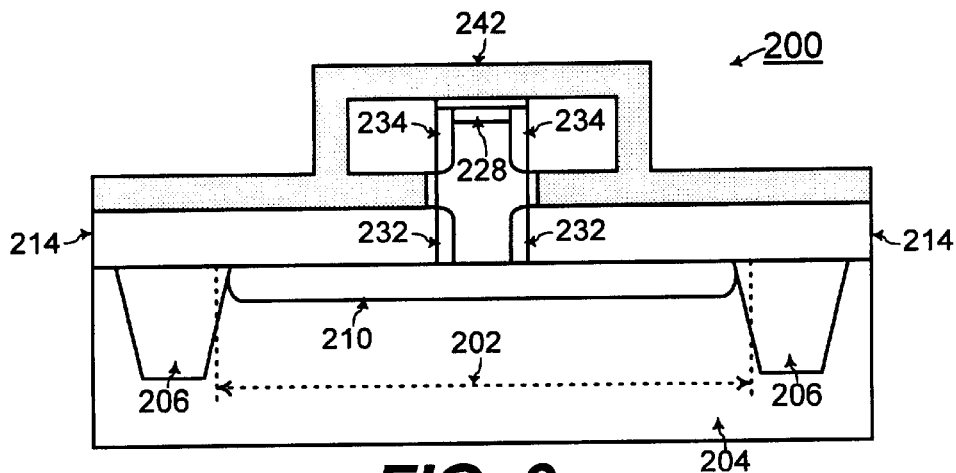

Referring to FIGS. 8 and 9, after formation of the gate dielectric 238, a gate electrode material 242 is conformally deposited to fill the gate electrode opening 237 between the top layer of doped insulating material 218 and the bottom layer of doped insulating material 214. The gate electrode material 242 is comprised of polysilicon according to one embodiment of the present invention. Processes for conformally depositing such gate electrode material 242 to fill the gate electrode opening 237 between the top layer of doped insulating material 218 and bottom layer of doped insulating material 214 are known to one of ordinary skill in the art of integrated circuit fabrication.

Figure 10:
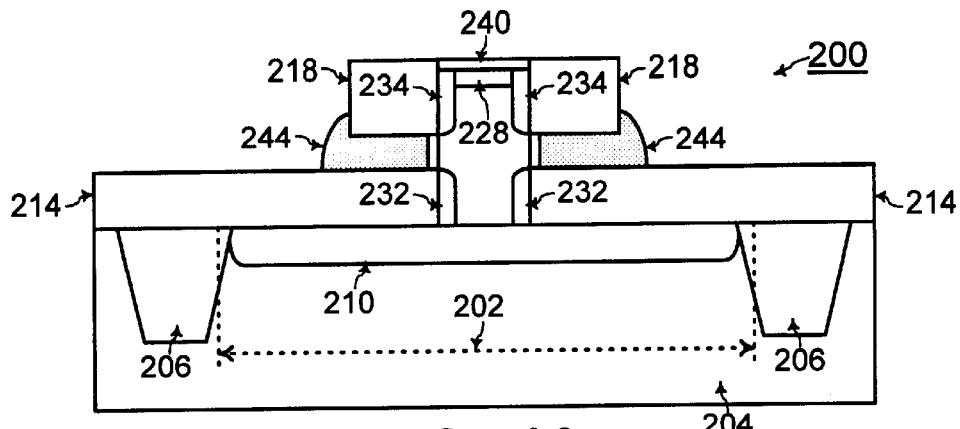

Referring to FIGS. 9 and 10, the gate electrode material 242 is anisotropically etched such that the gate electrode material 242 remains substantially between the top layer of doped insulating material 218 and the bottom layer of doped insulating material 214 to form a gate electrode 244 comprised of the gate electrode material 242. Processes for anisotropically etching the gate electrode material 242 to form the gate electrode 244 are known to one of ordinary skill in the art of integrated circuit fabrication.

Figure 11:
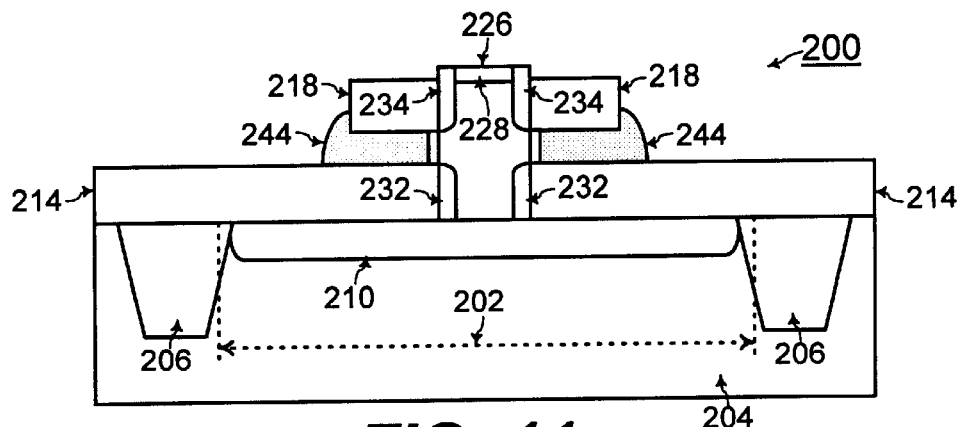

Referring to FIGS. 10 and 11, the silicon dioxide ($SiO_2$) structure 240 on top of the semiconductor fill 226 is etched away to expose the top surface of the semiconductor fill 226. In addition, the remaining inner portion of the top layer of doped insulating material 218 is etched down to expose the sidewalls of a portion of the semiconductor fill 226 near the top surface of the semiconductor fill 226. Processes for etching away the silicon dioxide ($SiO_2$) structure 240 on top of the semiconductor fill 226 and for etching down the top layer of doped insulating material 218 to expose the sidewalls of a portion of the semiconductor fill 226 near the top surface of the semiconductor fill 226 are known to one of ordinary skill in the art of integrated circuit fabrication.

Figure 12:
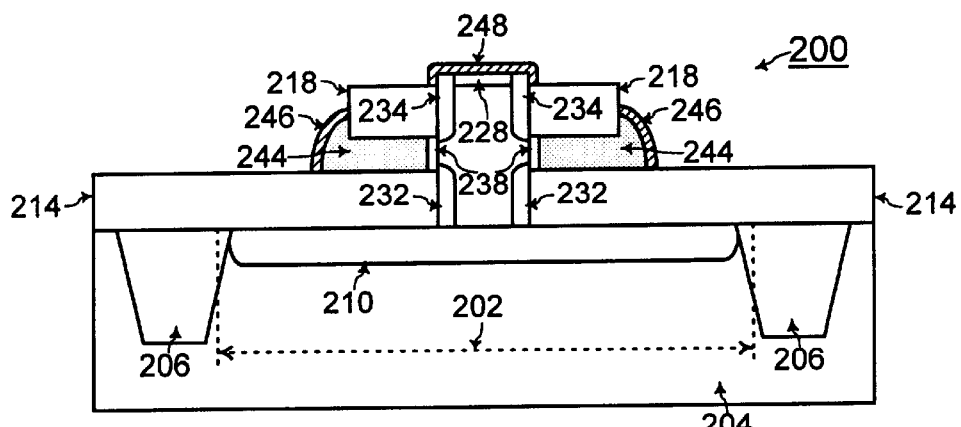

Referring to FIGS. 11 and 12, gate silicide 246 is formed with any exposed surface of the gate electrode 244 for providing contact to the gate of the vertical MOSFET 200. In addition, a drain or source silicide 248 is formed with any exposed surfaces of the semiconductor fill 226 for providing contact to the drain or source of the vertical MOSFET 200. The gate silicide 246 and the drain or source silicide 248 are comprised of nickel silicide (NiSi), cobalt silicide (CoSi), palladium silicide (PdSi), platinum silicide (PtSi), or any other silicide materials as known to one of ordinary skill in the art of integrated circuit fabrication. Processes for formation of such silicide materials are known to one of ordinary skill in the art of integrated circuit fabrication.

In one embodiment of the present invention, the first drain or source contact junction 210 is a drain contact junction 210 for providing contact to the drain of the vertical MOSFET 200. In that case, the first drain or source extension junction 232 is a drain extension junction, and the drain contact junction 210 and the drain extension junction 232 form the drain of the vertical MOSFET 200. In addition, the second drain or source extension junction 234 is a source extension junction, and the second drain or source contact junction 228 is a source contact junction that form the source of the vertical MOSFET 200. Alternatively, the first drain or source contact junction 210 may be used as a source contact junction, and the first drain or source extension junction 232 may be used as a source extension junction. In that case, the second drain or source contact junction 228 is used as a drain contact junction, and the second drain or source extension junction 234 is used as a drain extension junction.

Referring to FIG. 13, in another embodiment of the present invention, the dopant within each of the drain or source extension junctions 232 or 234 diffuse inwards toward the center of the semiconductor fill 226 to join together. Thus, referring to FIG. 13, the first drain or source extension junction 232 is formed from the second dopant being diffused from the bottom layer of doped insulating material 214 into the whole bottom portion of the semiconductor fill 226. Similarly, the second drain or source extension junction 234 is formed from the third dopant being diffused from the top layer of doped insulating material 218 into the whole top portion of the semiconductor fill 226. The middle portion of the semiconductor fill 226 abutting the gate dielectric 238 and disposed between the drain or source extensions junctions 232 and 234 forms the channel region of the vertical MOSFET 200.

Referring to FIG. 14, in a top view of the semiconductor fill 226, the semiconductor fill 226 is formed as a line within a trench as the opening 224, according to one embodiment of the present invention. Thus, the gate dielectric 238 and the gate electrode 244 abut two sidewalls of the semiconductor fill 226. In that case, the cross sectional views of FIGS. 2, 3, 4, 5, 6, 7, 8, 9, 10, 11, 12, and 13 are across dashed line A—A in FIG. 14. Alternatively, in a top view of the semiconductor fill 226 in FIG. 15A, the semiconductor fill 226 forms a square shape within a square hole as the opening 224. Thus, the gate dielectric 238 and the gate electrode 244 abut four sidewalls of the semiconductor fill 226, according to another embodiment of the present invention. In that case, the cross sectional views of FIGS. 2, 3, 4, 5, 6, 7, 8, 9, 10, 11, 12, and 13 are across dashed line B—B in FIG. 15A. In addition, in a top view of the semiconductor fill 226 in FIG. 15B, the semiconductor fill 226 forms a circular shape within a circular hole as the opening 224. Thus, the gate dielectric 238 and the gate electrode 244 surround the circular sidewall of the semiconductor fill 226, according to another embodiment of the present invention. In that case, the cross sectional views of FIGS. 2, 3, 4, 5, 6, 7, 8, 9, 10, 11, 12, and 13 are across dashed line C—C in FIG. 15B. The present invention may be practiced with other shapes of the semiconductor fill 226 and the opening 224, as would be apparent to one of ordinary skill in the art of integrated circuit fabrication from the description herein.

In any case, the gate electrode 244 and the gate dielectric 238 are formed on each of at least two planes surrounding the channel region of the vertical MOSFET 200 for better control of charge accumulation within the channel region such that undesired short channel effects are minimized. In addition, with application of bias voltage on the gate electrode 244 at each of at least two planes surrounding the channel region, higher drive current is achieved for enhanced speed performance of the vertical MOSFET 200. Furthermore, the length of the channel region is determined by the thickness of the layer of dummy material 216 deposited between the top and bottom layers of doped insulating material 218 and 214 while the drain or source extension junctions 232 and 234 are aligned with the top and bottom layers of doped insulating material 218 and 214. Thus, the length of the channel region of the vertical MOSFET 200 may be scaled down beyond those possible from photolithography limitations.

The foregoing is by way of example only and is not intended to be limiting. For example, any materials or dimensions specified herein are by way of example only. As will be understood by those skilled in the art, the integrated circuit structures described herein may be made or used in the same way regardless of their position and orientation. Accordingly, it is to be understood that terms and phrases such as "sidewall," "top," "bottom," and "on," as used herein refer to the relative location and orientation of various portions of the structures with respect to one another, and are not intended to suggest that any particular absolute orientation with respect to external objects is necessary or required.

In addition, example embodiments of the present invention are illustrated and described for forming a vertical MOSFET within an active device area of a bulk semiconductor substrate. However, the present invention may also be applied for forming a vertical MOSFET within an active device area of a semiconductor film formed on an insulating layer in SOI (semiconductor on insulator) technology, as would be apparent to one of ordinary skill in the art of integrated circuit fabrication from the description herein. Also, the semiconductor material of the semiconductor substrate or the semiconductor film in SOI technology are comprised of silicon or silicon doped with germanium, according to one embodiment of the present invention.

Furthermore, the embodiments of the present invention as described may be practiced with further modifications. For example, referring to FIG. 16, a top intermediary layer of undoped insulating material 252 is deposited between the top layer of doped insulating material 218 and the layer of dummy material 216, and a bottom intermediary layer of undoped insulating material 254 is deposited between the bottom layer of doped insulating material 214 and the layer of dummy material 216. The top and bottom intermediary layers of undoped insulating material 252 and 254 do not have any dopant therein and are comprised of substantially pure silicon dioxide ($SiO_2$) according to one embodiment of the present invention. Processes for depositing such top and bottom intermediary layers of undoped insulating material 252 and 254 are known to one of ordinary skill in the art of integrated circuit fabrication.

Figure 16:
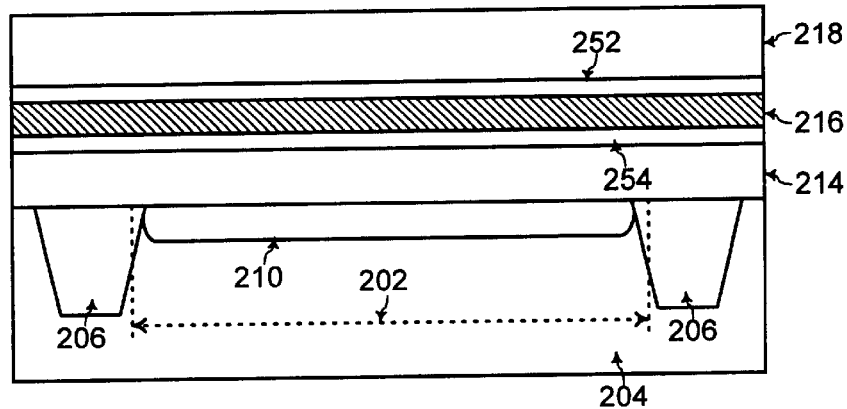
FIGS. 16, 17, and 18 show cross sectional views of a vertical MOSFET fabricated by forming a semiconductor fill within an opening formed through layers of doped insulating material and a layer of dummy material with addition of intermediary layers of undoped insulating material to minimize overlap capacitance between the gate electrode and the drain and source extension junctions, according to a further embodiment of the present invention.
Figure 17:
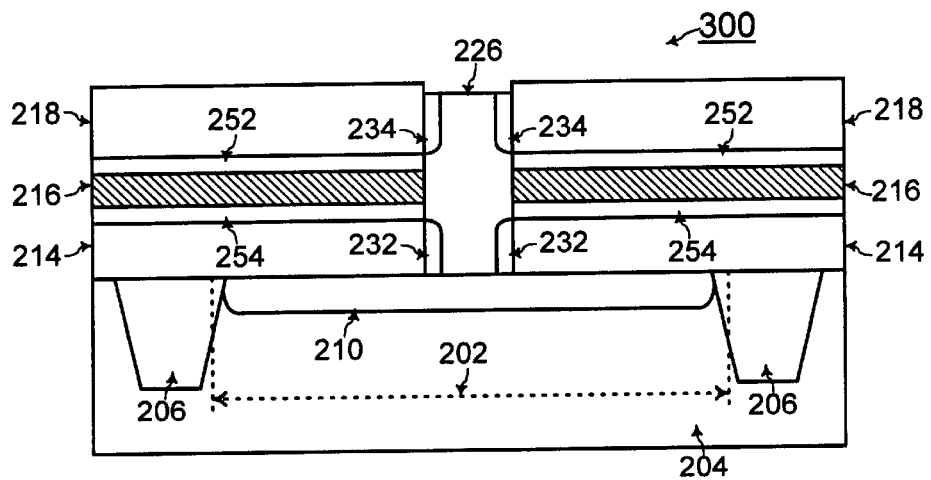
Figure 18:
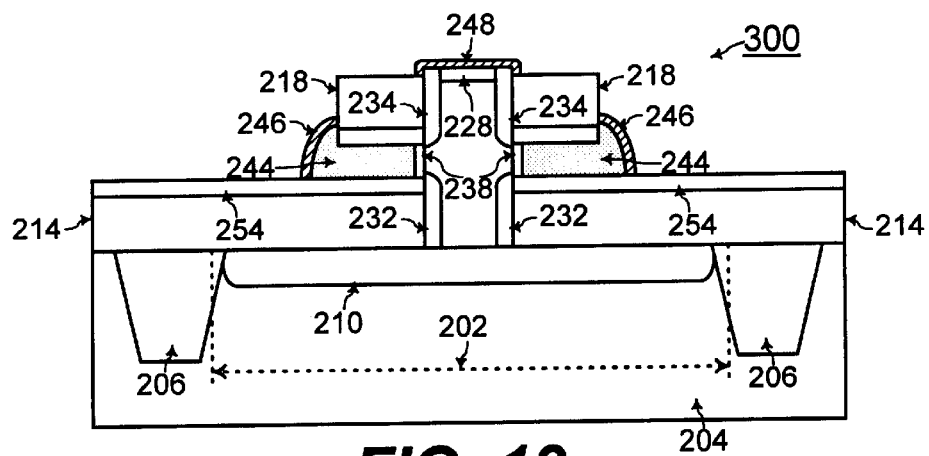

Referring to FIGS. 16, and 17, the semiconductor fill 226 of a vertical MOSFET 300 is formed within an opening formed through the top layer of doped insulating material 218, the top intermediary layer of undoped insulating material 252, the layer of dummy material 216, the bottom intermediary layer of undoped insulating material 254, and the bottom layer of doped insulating material 214, in a similar manner as described in reference to FIGS. 4 and 5. Referring to FIG. 18, the vertical MOSFET 300 is formed by etching away the layer of dummy material 216 in FIG. 17 and forming the gate dielectric 238 and the gate electrode 244, in a similar manner as described in reference to FIGS. 6, 7, 8, 9, 10, 11, and 12. Elements having the same reference number in FIGS. 1, 2, 3, 4, 5, 6, 7, 8, 9, 10, 11, 12, 16, 17, and 18 refer to elements having similar structure and function.

For the vertical MOSFET 300, the source or drain extension junctions 232 and 234 formed from dopants diffused from the top and bottom layers of the doped insulating material 218 and 214 are further removed from the channel region abutting the gate dielectric 238 because of insertion of the top and bottom intermediary layers of undoped insulating material 252 and 254. Thus, the overlap of the drain or source extension junctions 232 and 234 to the gate dielectric 238 is minimized to in turn minimize the overlap capacitance between the gate and the drain and source of the vertical MOSFET 300. Such minimized overlap capacitance between the gate and the drain and source advantageously results in enhanced speed performance of the vertical MOSFET 300.

Referring to FIGS. 3, 4, and 5, in another embodiment of the present invention, the bottom layer of doped insulating material 214 has a graduated dopant concentration of the second dopant with a lowest concentration toward the top near the layer of dummy material 214. In this manner, the first drain or source extension junction 232, formed from the second dopant diffused into the bottom portion of the semiconductor fill 226 from the bottom layer of doped insulating material 214, has a graduated dopant concentration with a lowest concentration toward the channel region. Similarly, the top layer of doped insulating material 218 has a graduated dopant concentration of the third dopant with a lowest concentration toward the bottom near the layer of dummy material 214. In this manner, the second drain or source extension junction 234, formed from the third dopant diffused into the top portion of the semiconductor fill 226 from the top layer of doped insulating material 218, has a graduated dopant concentration with a lowest concentration toward the channel region. A low concentration of dopant near the channel region within the drain or source extension junctions 232 and 234 further minimizes short channel effects of the vertical MOSFET 200.

In a further embodiment of the present invention, referring to FIGS. 3, 4, and 5, the concentration of the second dopant within the bottom layer of doped insulating material 214 is lower than the concentration of the third dopant within the top layer of doped insulating material 218. In this manner, the concentration of the second dopant within the first drain or source extension junction 232 is lower than the concentration of the third dopant within the second drain or source extension junction 234. Such a feature may be advantageous for formation of an asymmetric vertical MOSFET 200 with the first extension junction 232 being a drain extension junction and with the second extension junction 234 being a source extension junction. An asymmetric MOSFET with a highly doped source junction and with a lightly doped drain junction is advantageous for further minimizing short channel effects of the MOSFET, as known to one of ordinary skill in the art of integrated circuit fabrication.

Figure 19:
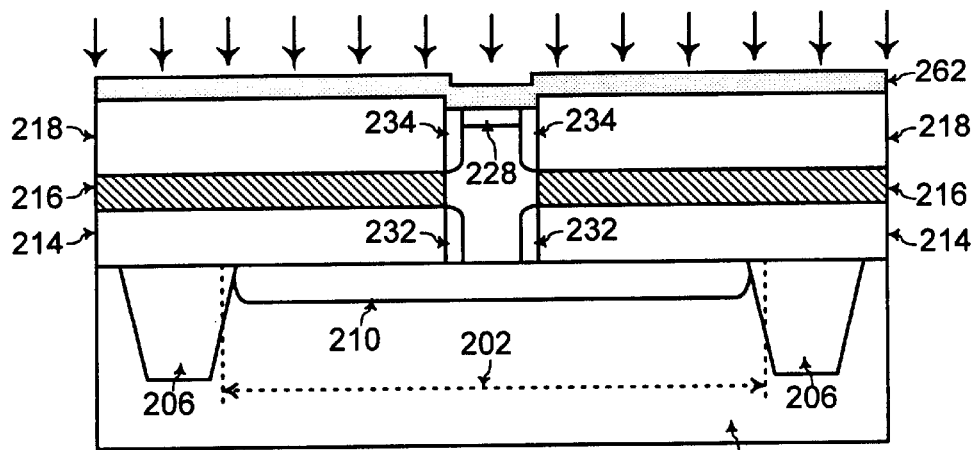
FIGS. 19, 20, and 21 show cross sectional views of a vertical MOSFET fabricated with deposition of an additional layer of semiconductor material on a top surface of the semiconductor fill to form low resistance contact to the drain or the source of the vertical MOSFET, according to another embodiment of the present invention.

Referring to FIGS. 3 and 19, in a further embodiment of the present invention, an added layer of semiconductor material 262 is deposited on the top surface of the semiconductor fill 226. The added layer of semiconductor material 262 is comprised of polysilicon when the semiconductor fill 226 is comprised of silicon. The fourth dopant for forming the second drain or source contact junction 228 is implanted into the added layer of semiconductor material 262.

Figure 20:
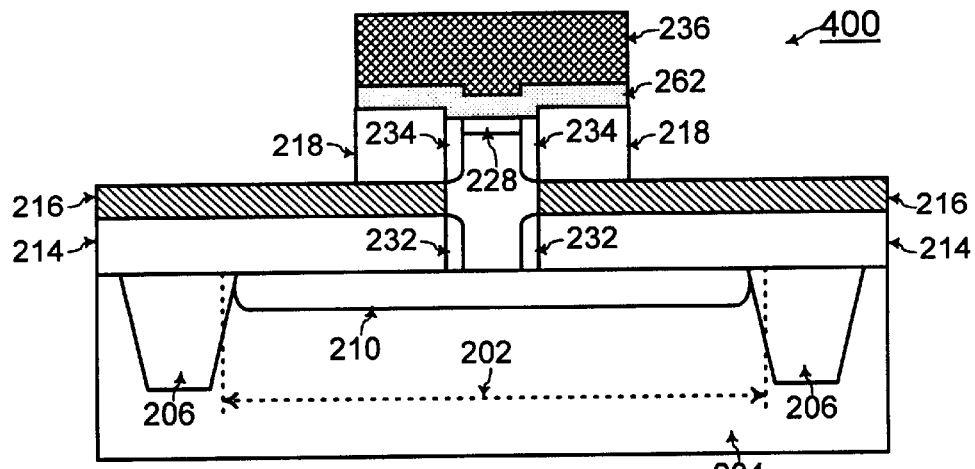
Figure 21:
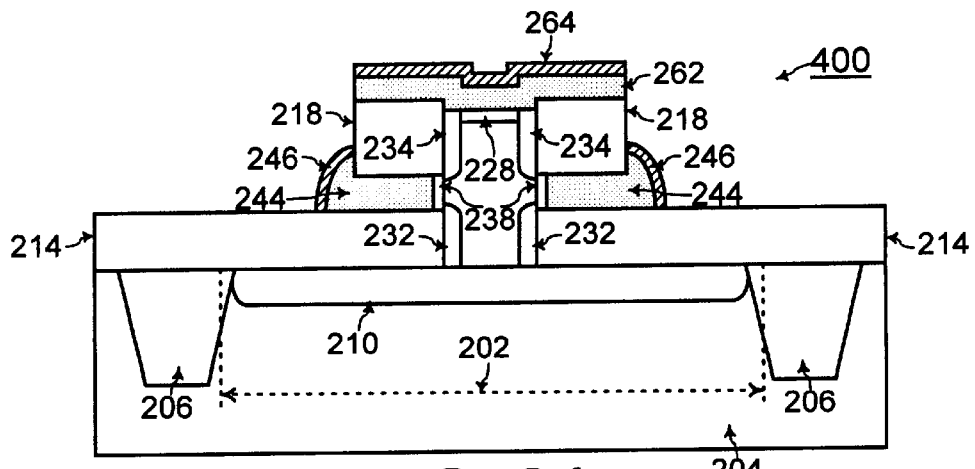

Referring to FIGS. 20 and 21, a vertical MOSFET 400 is formed by etching away the layer of dummy material 216 and forming the gate dielectric 238 and the gate electrode 244, in a similar manner as described in reference to FIGS. 6, 7, 8, 9, 10, 11, and 12. Elements having the same reference number in FIGS. 1, 2, 3, 4, 5, 6, 7, 8, 9, 10, 11, 12, 19, 20, and 21 refer to elements having similar structure and function. For the vertical MOSFET 400 of FIG. 21, a drain or source silicide 264 is formed with the added semiconductor material 262 to increase the volume of the drain or source silicide 264. The increased volume of the drain or source silicide 264 minimizes the resistance at the drain or source to enhance the speed performance of the vertical MOSFET 400.

Figure 22:
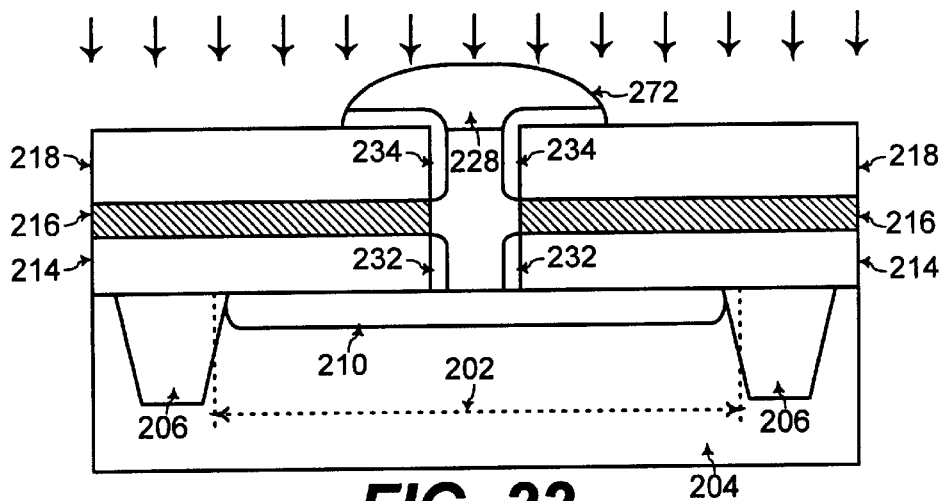
FIGS. 22, 23, and 24 show cross sectional views of a vertical MOSFET fabricated with epitaxial growth of an additional mushroom semiconductor structure on a top surface of the semiconductor fill to form low resistance contact to the drain or the source of the vertical MOSFET, according to a further embodiment of the present invention.
Figure 23:
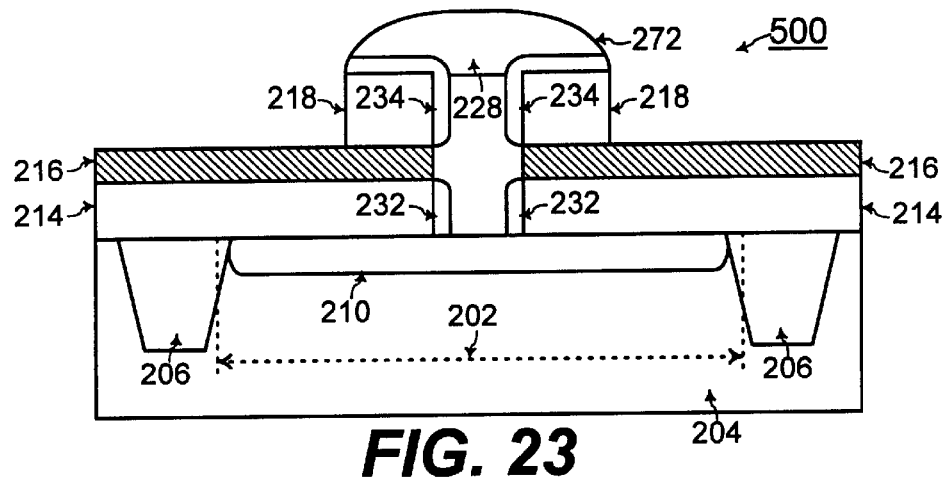

Referring to FIGS. 4, 5, and 22, the semiconductor fill 226 is epitaxially grown out of the opening 224 and onto the top layer of doped insulating material 218 to form a mushroom structure 272 of semiconductor material. The semiconductor fill 226 including the mushroom structure 272 is comprised of silicon. The fourth dopant for forming the second drain or source contact junction 228 is implanted into the mushroom structure 272. Referring to FIGS. 6 and 23, the mushroom structure 272 acts as a masking structure over an inner portion of the top layer of doped insulating material 218 such that the masking structure 236 comprised of photoresist material (in FIG. 6) is not needed. With the mushroom structure 272, an outer portion of the top layer of doped insulating material 218 not covered by the mushroom structure 272 is etched away.

Figure 24:
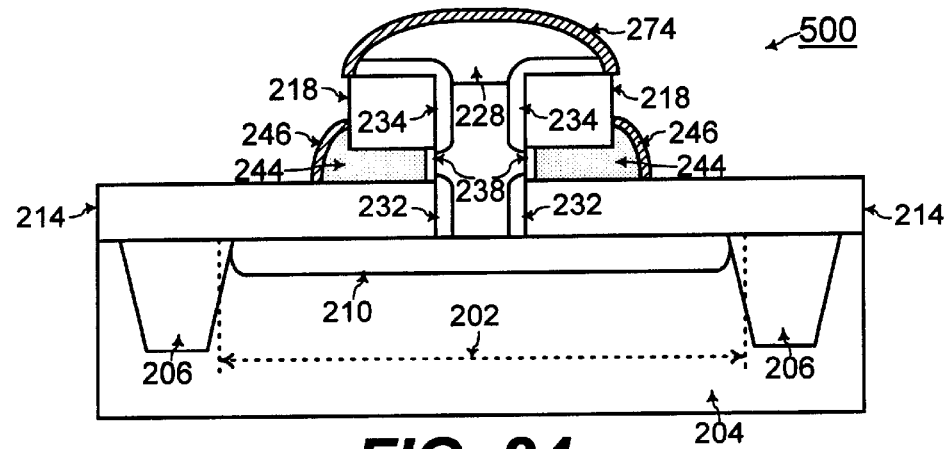

Referring to FIGS. 23 and 24, a vertical MOSFET 500 is formed by etching away the layer of dummy material 216 and forming the gate dielectric 238 and the gate electrode 244, in a similar manner as described in reference to FIGS. 6, 7, 8, 9, 10, 11, and 12. Elements having the same reference number in FIGS. 1, 2, 3, 4, 5, 6, 7, 8, 9, 10, 11, 12, 14, 15, 22, 23, and 24 refer to elements having similar structure and function. For the vertical MOSFET 500 of FIG. 24, a drain or source silicide 274 is formed with the mushroom structure 272 to increase the volume of the drain or source silicide 274. The increased volume of the drain or source silicide 274 minimizes the resistance at the drain or source to enhance the speed performance of the vertical MOSFET 500.

Figure 25:
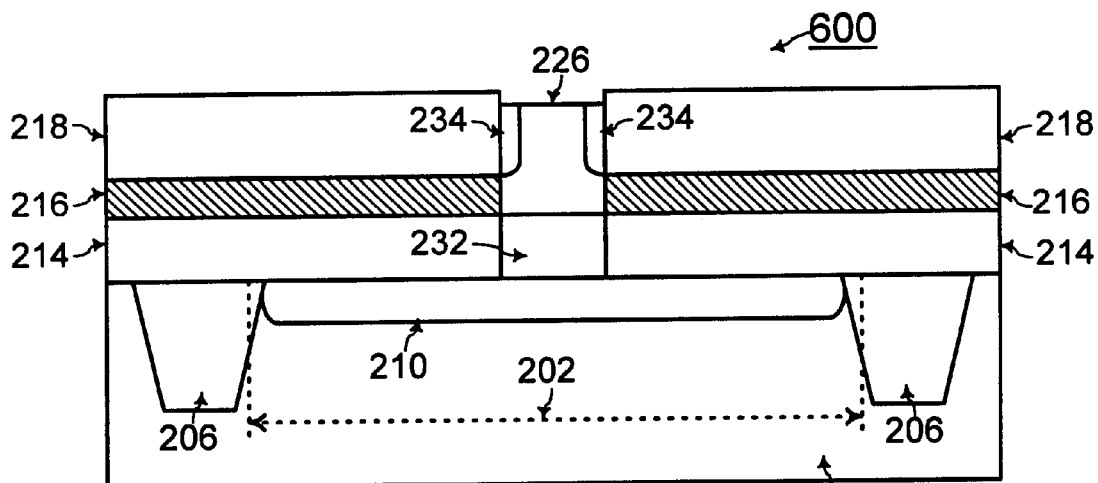
FIGS. 25 and 26 show cross sectional views of a vertical MOSFET fabricated with doping of the bottom drain or source extension junction from diffusion of dopant from the semiconductor substrate, according to another embodiment of the present invention.

Referring to FIG. 25, in another embodiment of the present invention for fabricating a vertical MOSFET 600, the bottom layer of insulating material 214 is not doped with the second dopant. In that case, the first drain or source extension junction 232 is doped with the first dopant diffusing into the first drain or source extension junction 232 from the first drain or source contact junction 210. The temperature used for epitaxial growth of silicon from tetrachloride ($SiCl_4$), trichlorosilane ($SiHCl_3$), dichlorosilane ($SiH_2Cl_2$), or silane ($SiH_4$) as a reactant decreases with a lower number of chlorine atoms and a higher number of hydrogen atoms for such reactants. For example, the temperature for epitaxial growth of silicon from tetrachloride ($SiCl_4$) is in a range of from about 1150° Celsius to about 1250° Celsius. The temperature for epitaxial growth of silicon from trichlorosilane ($SiHCl_3$) is in a range of from about 1100° Celsius to about 1200° Celsius. The temperature for epitaxial growth of silicon from dichlorosilane ($SiH_2Cl_2$) is in a range of from about 1050° Celsius to about 1150° Celsius. The temperature for epitaxial growth of silicon from silane ($SiH_4$) is in a range of from about 950° Celsius to about 1050° Celsius.

Referring to FIG. 25, the bottom portion of the semiconductor fill 226 is epitaxially grown using one of tetrachloride ($SiCl_4$), trichlorosilane ($SiHCl_3$), or dichlorosilane ($SiH_2Cl_2$) at the temperature range of 1050° Celsius to 1250° Celsius to form the bottom portion of the semiconductor fill 226. At such relatively high temperatures, the first dopant within the first drain or source contact junction 210 diffuses into the bottom portion of the semiconductor fill 226 during the epitaxial growth of the bottom portion of the semiconductor fill 226 to form the first drain or source extension junction 232. When the bottom layer of insulating material 214 is not doped with the second dopant, the first drain or source extension junction 232 in this manner is doped with the first dopant diffused from the first drain or source contact junction 210.

Figure 26:
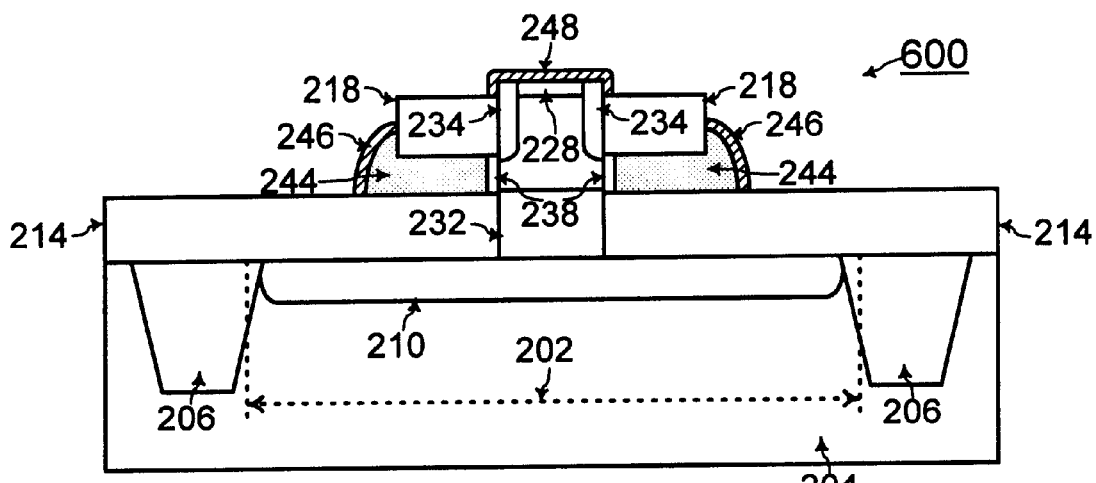

Once the bottom portion of the semiconductor fill 226 reaches the layer of dummy material 216, the middle and top portion of the semiconductor fill 226 are epitaxially grown using silane (SiH$_4$) at the lower temperature of about 950° Celsius to about 1050° Celsius. Referring to FIG. 25, the second drain and source extension junction 234 is formed from diffuision of the third dopant from the top layer of doped insulating material 218. Referring to FIG. 26, the vertical MOSFET 600 is formed by etching away the layer of dummy material 216 in FIG. 25 and forming the gate dielectric 238 and the gate electrode 244, in a similar manner as described in reference to FIGS. 6, 7, 8, 9, 10, 11, and 12. Elements having the same reference number in FIGS. 1, 2, 3, 4, 5, 6, 7, 8, 9, 10, 11, 12, 25, and 26 refer to elements having similar structure and function. The MOSFET 600 may be used to particular advantage for formation of an asymmetric MOSFET since the first drain or source extension junction 232 and the second drain or source extension junction 234 are doped differently.

The invention is limited only as defined in the following claims and equivalents thereof.

We claim:

1. A method for fabricating a vertical field effect transistor on a semiconductor substrate, the method including the steps of:
   A. forming a first drain or source contact region doped with a first dopant within an active device area of said semiconductor substrate;
   B. depositing a bottom layer of doped insulating material on said semiconductor substrate, said bottom layer of doped insulating material being doped with a second dopant;
   C. depositing a layer of dummy material on said bottom layer of doped insulating material;
   D. depositing a top layer of doped insulating material on said layer of dummy material, said top layer of doped insulating material being doped with a third dopant;
   E. etching an opening through said top layer of doped insulating material, said layer of dummy material, and said bottom layer of doped insulating material;
      wherein said opening is disposed over said active device area of said semiconductor substrate such that said opening has a bottom wall of said semiconductor substrate;
   F. filling said opening with a semiconductor material to form a semiconductor fill contained within said opening;
      wherein said semiconductor fill has at least one sidewall with a top portion of said at least one sidewall abutting said top layer of doped insulating material, and with a middle portion of said at least one sidewall abutting said layer of dummy material, and with a bottom portion of said at least one sidewall abutting said bottom layer of doped insulating material;
   G. etching away said layer of dummy material such that said middle portion of said at least one sidewall of said semiconductor fill is exposed;
      wherein a gate electrode opening disposed between said top and bottom layers of doped insulating material is formed when said layer of dummy material is etched away;
   H. forming a gate dielectric of said vertical field effect transistor on said exposed middle portion of said at least one sidewall of said semiconductor fill;
      wherein said middle portion of said semiconductor fill abutting said gate dielectric forms a channel region of said vertical field effect transistor;
   I. filling said gate electrode opening between said top and bottom layers of doped insulating material with a gate electrode material, wherein said gate electrode material abuts said gate dielectric to form a gate electrode of said vertical field effect transistor;
      wherein said gate dielectric and said gate electrode formed at said at least one sidewall of said semiconductor fill is disposed on a plurality of planes of said channel region of said vertical field effect transistor; and
   J. performing a thermal anneal such that said second dopant diffuses from said bottom layer of doped insulating material into said bottom portion of said semiconductor fill to form a first drain or source extension junction of said vertical field effect transistor, and such that said third dopant diffuses from said top layer of doped insulating material into said top portion of said semiconductor fill to form a second drain or source extension junction of said vertical field effect transistor.

2. The method of claim 1, wherein said semiconductor fill is formed as a line within a trench line as said opening such that said gate dielectric and said gate electrode are formed at each of two sidewalls of said semiconductor fill.

3. The method of claim 1, wherein said semiconductor fill is formed to have a square shape within a square hole as said opening such that said gate dielectric and said gate electrode are formed at each of four sidewalls of said semiconductor fill.

4. The method of claim 1, wherein said semiconductor fill is formed to have a circular shape within a circular hole as said opening such that said gate dielectric and said gate electrode are formed to surround said circular semiconductor fill.

5. The method of claim 1, further including the step of:
   implanting a fourth dopant through an exposed top surface of said semiconductor fill to form a second drain or source contact junction.

6. The method of claim 5, wherein said first, second, third, and fourth dopants are the same dopant that is an N-type dopant for fabrication of a vertical NMOSFET (N-channel Metal Oxide Semiconductor Field Effect Transistor) and that is a P-type dopant for fabrication of a vertical PMOSFET (P-channel Metal Oxide Semiconductor Field Effect Transistor).

7. The method of claim 5, wherein said bottom and top layers of said doped insulating material are comprised of PSG (phospho-silicate glass) such that said second and third dopants are comprised of phosphorous for formation of a vertical NMOSFET (N-channel Metal Oxide Semiconductor Field Effect Transistor).

8. The method of claim 5, wherein said bottom and top layers of said doped insulating material are comprised of BSG (boro-silicate glass) such that said second and third dopants are comprised of boron for formation of a vertical PMOSFET (P-channel Metal Oxide Semiconductor Field Effect Transistor).

9. The method of claim 5, wherein said first dopant implanted into said active device area of said semiconductor substrate forms a drain contact junction of said vertical field effect transistor, wherein said second dopant diffused into said bottom portion of said semiconductor fill from said bottom layer of doped insulating material forms a drain extension junction of said vertical field effect transistor, wherein said third dopant diffused into said top portion of said semiconductor fill from said top layer of doped insulating material forms a source extension junction of said vertical field effect transistor, and wherein said fourth dopant implanted through said top surface of said semiconductor fill forms a source contact junction of said vertical field effect transistor.

10. The method of claim 9, further including the step of:
   forming silicide with said source contact junction at said exposed top surface of said semiconductor fill to provide contact to a source of said vertical field effect transistor.

11. The method of claim 9, further including the step of:
   depositing a top intermediary layer of undoped insulating material between said top layer of doped insulating material and said layer of dummy material, before said step E of etching said opening, such that said source extension junction, formed from said third dopant diffused into said top portion of said semiconductor fill from said top layer of doped insulating material, has minimized overlap with said gate dielectric.

12. The method of claim 9, further including the step of:
   depositing a bottom intermediary layer of undoped insulating material between said bottom layer of doped insulating material and said layer of dummy material, before said step E of etching said opening such that said drain extension junction, formed from said second dopant diffused into said bottom portion of said semiconductor fill from said bottom layer of doped insulating material, has minimized overlap with said gate dielectric.

13. The method of claim 9, further including the step of:
   doping said bottom layer of doped insulating material to have a graduated dopant concentration with a lowest concentration toward the top near said layer of dummy material such that said drain extension junction, formed from said second dopant diffused into said bottom portion of said semiconductor fill from said bottom layer of doped insulating material, has a graduated dopant concentration with a lowest concentration toward the channel region.

14. The method of claim 9, further including the step of:
   doping said top layer of doped insulating material to have a graduated dopant concentration with a lowest concentration toward the bottom near said layer of dummy material such that said source extension junction, formed from said third dopant diffused into said top portion of said semiconductor fill from said top layer of doped insulating material, has a graduated dopant concentration with a lowest concentration toward the channel region.

15. The method of claim 9, wherein a concentration of said second dopant within said bottom layer of doped insulating material is lower than a concentration of said third dopant within said top layer of doped insulating material such that said second dopant within said drain extension junction has a lower concentration than of said third dopant within said source extension junction.

16. The method of claim 9, wherein said bottom layer of insulating material is not doped with said second dopant, and wherein said bottom portion of said semiconductor fill is doped with said first dopant diffusing from said drain contact junction of said semiconductor substrate and into said bottom portion of said semiconductor fill to form said drain extension junction.

17. The method of claim 1, further including the steps of:
   etching away an outside portion of said top layer of doped insulating material such that an inside portion of said top layer of doped insulating material remains to surround said top portion of said semiconductor fill, before said step G;
   anisotropically etching any exposed regions of said gate electrode material such that said gate electrode material remains substantially between said inside portion of said top layer of doped insulating material and said bottom layer of doped insulating material to form said gate electrode; and
   forming silicide at any exposed surface of said remaining gate electrode material to provide contact to said gate electrode of said vertical field effect transistor.

18. The method of claim 1, wherein said semiconductor substrate is comprised of silicon, wherein said semiconductor material of said semiconductor fill is epitaxially grown from said silicon at said bottom wall of said opening in said step F, and wherein said gate electrode material is comprised of polysilicon.

19. The method of claim 18, wherein said top and bottom layers of doped insulating material are comprised of doped silicon dioxide ($SiO_2$), and wherein said layer of dummy material is comprised of silicon nitride ($Si_3N_4$) or silicon oxynitride (SiON).

20. The method of claim 1, further including the step of:
   forming additional semiconductor material on top of said semiconductor fill; and
   implanting a fourth dopant into said additional semiconductor material on top of said semiconductor fill to form a second drain or source contact junction of said vertical field effect transistor.

21. The method of claim 20, further including the step of:
   forming silicide with said additional semiconductor material to provide contact to a drain or source of said vertical field effect transistor.

* * * * *